United States Patent
Shi et al.

(10) Patent No.: US 12,310,219 B2
(45) Date of Patent: May 20, 2025

(54) OLED DISPLAY PANEL, MANUFACTURING METHOD THEREOF, AND OLED DISPLAY MODULE

(71) Applicant: Shenzhen China Star Optoelectronics Semiconductor Display Technology Co., Ltd., Guangdong (CN)

(72) Inventors: Guolong Shi, Shenzhen (CN); Weijia Xie, Shenzhen (CN); Wei Li, Shenzhen (CN)

(73) Assignee: Shenzhen China Star Optoelectronics Semiconductor Display Technology Co., Ltd, Shenzhen (CN)

( * ) Notice: Subject to any disclaimer, the term of this patent is extended or adjusted under 35 U.S.C. 154(b) by 0 days.

(21) Appl. No.: 17/760,859

(22) PCT Filed: Feb. 23, 2022

(86) PCT No.: PCT/CN2022/077472
§ 371 (c)(1),
(2) Date: Mar. 16, 2022

(87) PCT Pub. No.: WO2023/151127
PCT Pub. Date: Aug. 17, 2023

(65) Prior Publication Data
US 2024/0389428 A1 Nov. 21, 2024

(30) Foreign Application Priority Data
Feb. 9, 2022 (CN) .......................... 202210122710.6

(51) Int. Cl.
*H01L 29/08* (2006.01)
*H10K 59/12* (2023.01)
(Continued)

(52) U.S. Cl.
CPC ......... *H10K 59/65* (2023.02); *H10K 59/1201* (2023.02); *H10K 59/124* (2023.02);
(Continued)

(58) Field of Classification Search
CPC .. H10K 59/65; H10K 59/131; H10K 59/1201; H10K 59/126; H10K 59/124; H10K 71/00; H10K 2102/101
(Continued)

(56) References Cited

U.S. PATENT DOCUMENTS

| | | | | |
|---|---|---|---|---|
| 2019/0172873 | A1* | 6/2019 | Ji | H10K 59/87 |
| 2021/0202568 | A1* | 7/2021 | Kim | H10K 59/65 |
| 2022/0208869 | A1* | 6/2022 | Jeong | H10K 59/65 |

FOREIGN PATENT DOCUMENTS

| | | |
|---|---|---|
| CN | 109801950 A | 5/2019 |
| CN | 210200763 U | 3/2020 |

(Continued)

OTHER PUBLICATIONS

International Search Report in International application No. PCT/CN2022/077472, mailed on Jun. 29, 2022.
(Continued)

*Primary Examiner* — Phuc T Dang
(74) *Attorney, Agent, or Firm* — Nathan & Associates; Menachem Nathan (57) ABSTRACT

The OLED display panel includes a thin film transistor (TFT) array substrate and a light-emitting device layer. The TFT array substrate includes a TFT disposed in pixel areas. The light-emitting device layer is disposed on the TFT array substrate, and includes a first light-emitting device disposed in the pixel areas and connected to the TFT and a second light-emitting device disposed in a light-transmitting area and connected to the first light-emitting device. The second light-emitting device includes a first transparent electrode, a
(Continued)

second OLED functional layer disposed on the first transparent electrode, and a second transparent electrode disposed on the second OLED functional layer.

17 Claims, 6 Drawing Sheets

(51) Int. Cl.
    *H10K 59/124*   (2023.01)
    *H10K 59/126*   (2023.01)
    *H10K 59/131*   (2023.01)
    *H10K 59/65*    (2023.01)
    *H10K 59/80*    (2023.01)
    *H10K 71/60*    (2023.01)
    *H10K 102/10*   (2023.01)
(52) U.S. Cl.
    CPC ......... *H10K 59/126* (2023.02); *H10K 59/131* (2023.02); *H10K 59/80517* (2023.02); *H10K 59/878* (2023.02); *H10K 59/879* (2023.02); *H10K 71/60* (2023.02); *H10K 2102/101* (2023.02)
(58) Field of Classification Search
    USPC .......................................................... 257/40
    See application file for complete search history.

(56) References Cited

FOREIGN PATENT DOCUMENTS

| | | | | |
|---|---|---|---|---|
| CN | 111430414 A | | 7/2020 | |
| CN | 111554727 A | | 8/2020 | |
| CN | 111725266 A | | 9/2020 | |
| CN | 111833720 A | | 10/2020 | |
| CN | 112750965 A | | 5/2021 | |
| CN | 113270562 A | | 8/2021 | |
| CN | 113394261 A | * | 9/2021 | |
| KR | 20160071884 A | | 6/2016 | |
| KR | 20160099979 A | * | 8/2016 | ........... H10K 59/123 |
| KR | 202101018535 A | * | 9/2021 | ........... H10K 59/123 |
| WO | WO-2021213510 A1 | * | 10/2021 | ........... H01L 27/322 |
| WO | WO-2021215808 A1 | * | 10/2021 | ........... G02B 5/3033 |

OTHER PUBLICATIONS

Written Opinion of the International Search Authority in International application No. PCT/CN2022/077472, mailed on Jun. 29, 2022.

Chinese Office Action issued in corresponding Chinese Patent Application No. 202210122710.6 dated Oct. 26, 2024, pp. 1-6.

* cited by examiner

| Providing a TFT array substrate, wherein, the TFT array substrate includes a display area and a CUP area in the display area, the CUP area includes a plurality of pixel areas disposed at intervals and a light-transmitting area between two adjacent pixel areas, and the TFT array substrate includes a TFT disposed in the pixel areas. | ~S1 |

↓

| Manufacturing a light-emitting device layer on the TFT array substrate, wherein, the light-emitting device layer includes a first light-emitting device disposed in the pixel areas and connected to the TFT and a second light-emitting device disposed in the light-transmitting area and connected to the first light-emitting device; wherein, the second light-emitting device includes a first transparent electrode, a second OLED functional layer disposed on the first transparent electrode, and a second transparent electrode disposed on the second OLED functional layer. | ~S2 |

FIG. 8

OLED DISPLAY PANEL, MANUFACTURING METHOD THEREOF, AND OLED DISPLAY MODULE

FIELD OF INVENTION

The present disclosure relates to the field of display device technologies, and more particularly, to an OLED display panel, a manufacturing method thereof, and an OLED display module.

BACKGROUND OF INVENTION

Organic light-emitting diodes (OLEDs) have advantages of simple preparation processes, low cost, high luminous efficiency, easiness to form flexible structures, low power consumption, high color saturation, and wide viewing angles, so display technologies of using OLEDs have become important display technologies.

OLEDs are current-type light-emitting devices, which mainly include an anode, a cathode, and an OLED functional layer. A main working principle of OLEDs is that the OLED functional layer emits light by injection and recombination of carriers under driving of an electric field generated by the anode and the cathode.

In recent years, full-screen display devices have received extensive attention from markets and have broad application prospects. In current technology, the full-screen display devices are realized by disposing an under-screen photosensitive element, such as a camera, a light sensor, a fingerprint sensor, etc., under a display area. The display area corresponding to the photosensitive element is called a camera-under-panel (CUP) area. However, in current technology, a plurality of pixels in CUP areas of the full-screen display devices will cause a lower transmittance in the CUP areas and results in a problem of poor photosensitive effects.

Technical problem: the present disclosure provides an OLED display panel, a manufacturing method thereof, and an OLED display module to solve the problem of lower transmittance in the CUP areas in current technology.

SUMMARY OF INVENTION

In a first aspect, an embodiment of the present disclosure provides an organic light-emitting diode (OLED) display panel, which includes a display area and a camera-under-panel (CUP) area in the display area, wherein the CUP area includes a plurality of pixel areas disposed at intervals and a light-transmitting area between two adjacent pixel areas, and the OLED display panel includes:
  a thin film transistor (TFT) array substrate including a TFT disposed in the pixel areas; and
  a light-emitting device layer disposed on the TFT array substrate, wherein, the light-emitting device layer includes a first light-emitting device disposed in the pixel areas and connected to the TFT and a second light-emitting device disposed in the light-transmitting area and connected to the first light-emitting device;
  wherein, the second light-emitting device includes a first transparent electrode, a second OLED functional layer disposed on the first transparent electrode, and a second transparent electrode disposed on the second OLED functional layer.

In the OLED display panel, the first light-emitting device includes a first electrode, a first OLED functional layer disposed on the first electrode, and a second electrode disposed on the first OLED functional layer; and the first transparent electrode is connected to the first electrode, and the second transparent electrode is connected to the second electrode.

In the OLED display panel, the first transparent electrode is integrally formed with the first electrode, and the second transparent electrode is integrally formed with the second electrode.

In the OLED display panel, the second OLED functional layer is integrally formed with the first OLED functional layer.

In the OLED display panel, the first electrode includes a first transparent metal oxide layer, a metal layer disposed on the first transparent metal oxide layer, and a second transparent metal oxide layer disposed on the metal layer; and
  the first transparent electrode is integrally formed with the first transparent metal oxide layer.

In the OLED display panel, the TFT array substrate further includes a reflection unit disposed in the pixel areas, and a refraction unit disposed in the light-transmitting area; and
  the refraction unit is disposed directly below the second light-emitting device for refracting a part of light emitted from the second light-emitting device and/or a part of external light to the reflection unit and for refracting reflected light from the reflection unit outside the OLED display panel.

In the OLED display panel, the TFT array substrate further includes:
  a first insulating layer disposed on the TFT, wherein, a side surface of the first insulating layer is an inclined plane, and the reflection unit is disposed on the inclined plane; and
  a second insulating layer disposed on the TFT, the reflection unit, and the first insulating layer, wherein, the refraction unit is disposed on the second insulating layer.

In the OLED display panel, the TFT array substrate further includes a light-shielding layer disposed under the TFT, and the reflection unit is disposed directly above the light-shielding layer.

In a second aspect, an embodiment of the present disclosure further provides an OLED display module, which includes an OLED display panel and a photosensitive element;
  wherein, the OLED display panel includes a display area and a camera-under-panel (CUP) area in the display area, the CUP area includes a plurality of pixel areas disposed at intervals and a light-transmitting area between two adjacent pixel areas, and the OLED display panel includes:
  a thin film transistor (TFT) array substrate including a TFT disposed in the pixel areas; and
  a light-emitting device layer disposed on the TFT array substrate, wherein, the light-emitting device layer includes a first light-emitting device disposed in the pixel areas and connected to the TFT and a second light-emitting device disposed in the light-transmitting area and connected to the first light-emitting device;
  wherein, the second light-emitting device includes a first transparent electrode, a second OLED functional layer disposed on the first transparent electrode, and a second transparent electrode disposed on the second OLED functional layer; and
  the photosensitive element is disposed under the CUP area.

In the OLED display module, the first light-emitting device includes a first electrode, a first OLED functional layer disposed on the first electrode, and a second electrode disposed on the first OLED functional layer; and
   the first transparent electrode is connected to the first electrode, and the second transparent electrode is connected to the second electrode.

In the OLED display module, the first transparent electrode is integrally formed with the first electrode, and the second transparent electrode is integrally formed with the second electrode.

In the OLED display module, the second OLED functional layer is integrally formed with the first OLED functional layer.

In the OLED display module, the first electrode includes a first transparent metal oxide layer, a metal layer disposed on the first transparent metal oxide layer, and a second transparent metal oxide layer disposed on the metal layer; and
   the first transparent electrode is integrally formed with the first transparent metal oxide layer.

In the OLED display module, the TFT array substrate further includes a reflection unit disposed in the pixel areas, and a refraction unit disposed in the light-transmitting area; and
   the refraction unit is disposed directly below the second light-emitting device for refracting a part of light emitted from the second light-emitting device and/or a part of external light to the reflection unit and for refracting reflected light from the reflection unit outside the OLED display panel.

In the OLED display module, the TFT array substrate further includes:
   a first insulating layer disposed on the TFT, wherein, a side surface of the first insulating layer is an inclined plane, and the reflection unit is disposed on the inclined plane; and
   a second insulating layer disposed on the TFT, the reflection unit, and the first insulating layer, wherein, the refraction unit is disposed on the second insulating layer.

In the OLED display module, the TFT array substrate further includes a light-shielding layer disposed under the TFT, and the reflection unit is disposed directly above the light-shielding layer.

In a third aspect, an embodiment of the present disclosure further provides a manufacturing method of an organic light-emitting diode (OLED) display panel, which includes following steps:
   providing a thin film transistor (TFT) array substrate, wherein, the TFT array substrate includes a display area and a camera-under-panel (CUP) area in the display area, the CUP area includes a plurality of pixel areas disposed at intervals and a light-transmitting area between two adjacent pixel areas, and the TFT array substrate includes a TFT disposed in the pixel areas; and
   manufacturing a light-emitting device layer on the TFT array substrate, wherein, the light-emitting device layer includes a first light-emitting device disposed in the pixel areas and connected to the TFT and a second light-emitting device disposed in the light-transmitting area and connected to the first light-emitting device; wherein, the second light-emitting device includes a first transparent electrode, a second OLED functional layer disposed on the first transparent electrode, and a second transparent electrode disposed on the second OLED functional layer.

In the manufacturing method of the OLED display panel, the first light-emitting device includes a first electrode, a first OLED functional layer disposed on the first electrode, and a second electrode disposed on the first OLED functional layer; and
   the first transparent electrode is connected to the first electrode, and the second transparent electrode is connected to the second electrode.

In the manufacturing method of the OLED display panel, the first transparent electrode is integrally formed with the first electrode, and the second transparent electrode is integrally formed with the second electrode.

In the manufacturing method of the OLED display panel, the second OLED functional layer is integrally formed with the first OLED functional layer.

Beneficial effect: compared to current technology, the OLED display panel provided by the present disclosure includes the display area and the CUP area positioned in the display area, the CUP area includes the plurality of pixel areas and the light-transmitting area disposed between the two adjacent pixel areas, and the OLED display panel includes the TFT array substrate and the light-emitting device layer. The TFT array substrate includes the TFT disposed in the pixel areas. The light-emitting device layer is disposed on the TFT array substrate, and includes the first light-emitting device disposed in the pixel areas and connected to the TFT and the second light-emitting device disposed in the light-transmitting area and connected to the first light-emitting device. The second light-emitting device includes the first transparent electrode, the second OLED functional layer disposed on the first transparent electrode, and the second transparent electrode disposed on the second OLED functional layer. That is, the present disclosure disposes the second light-emitting device in the light-transmitting area, the second light-emitting device can emit light at both sides, and the second light-emitting device is connected to the first light-emitting device in the pixel areas. Therefore, there is no need to dispose driving circuits in the light-transmitting area, which reduces light-blocking structures, thereby improving transmittance in the CUP area and further improving a photosensitive effect of the photosensitive element.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one of these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection; it can mean a mechanical connection, an electrical connection, or can communicate with each other; it can mean a direct connection, an indirect connection by an intermediary, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The following description provides many different embodiments or examples for implementing different structures of the present disclosure. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

Referring to FIGS. 1 to 7, an embodiment of the present disclosure provides an organic light-emitting diode (OLED) display panel 100, which includes a display area 101 and a camera-under-panel (CUP) area 102 positioned in the display area 101. The CUP area 102 includes a plurality of pixel areas 1021 disposed at intervals and a light-transmitting area 1022 between two adjacent pixel areas 1021. The OLED display panel 100 includes:
a thin film transistor (TFT) array substrate 1, wherein, the TFT array substrate 1 includes a TFT 11 disposed in the pixel areas 1021; and
a light-emitting device layer 2 disposed on the TFT array substrate 1, wherein, the light-emitting device layer 2 includes a first light-emitting device 21 disposed in the pixel areas 1021 and connected to the TFT 11 and a second light-emitting device 22 disposed in the light-transmitting area 1022 and connected to the first light-emitting device 21.

Figure 3:
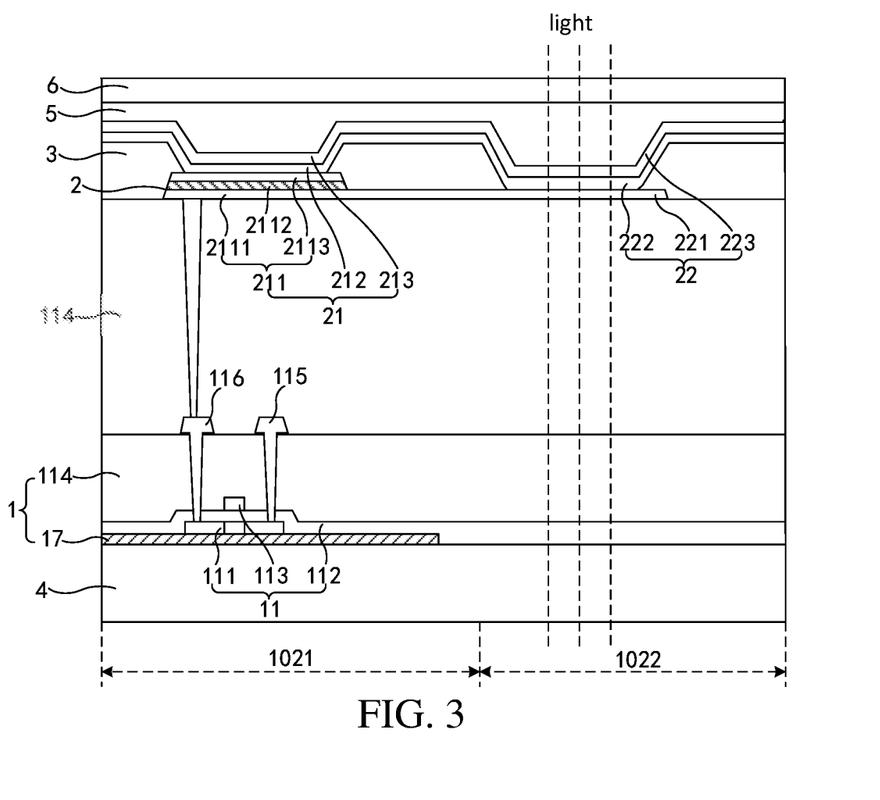
FIG. 3 is a cross-sectional diagram of line A-A in FIG. 2 according to an embodiment of the present disclosure.
Figure 4:
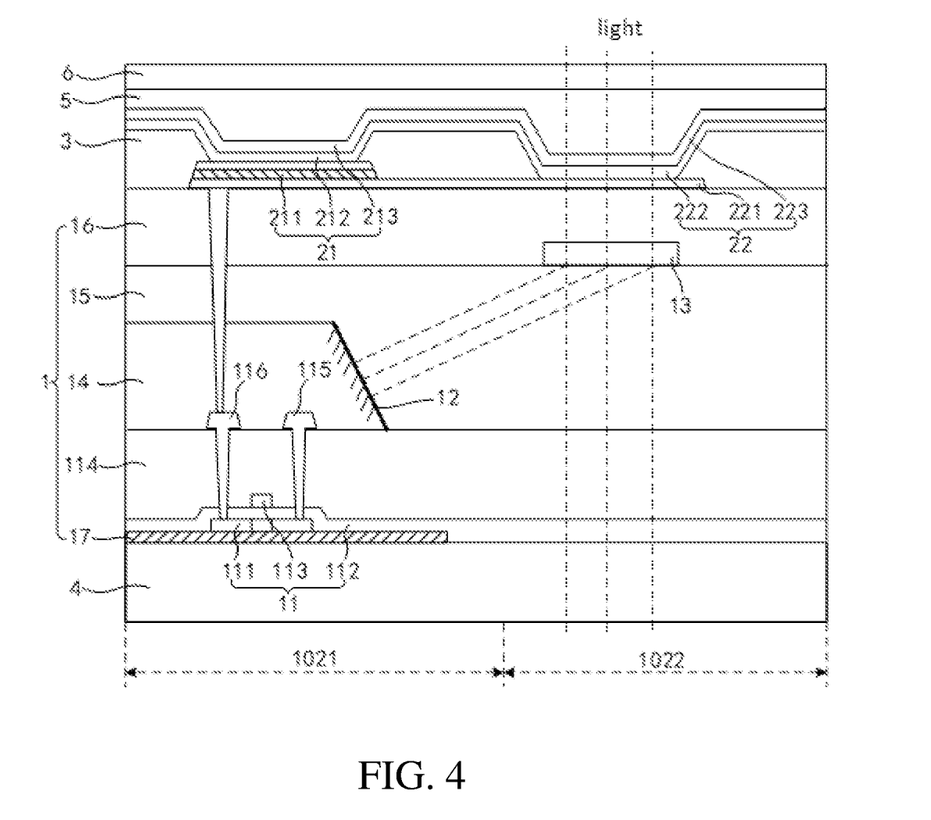
FIG. 4 is a cross-sectional diagram of the line A-A in FIG. 2 according to another embodiment of the present disclosure.

The second light-emitting device 22 includes a first transparent electrode 221, a second OLED functional layer 222 disposed on the first transparent electrode 221, and a second transparent electrode 223 disposed on the second OLED functional layer 222.

Figure 1:
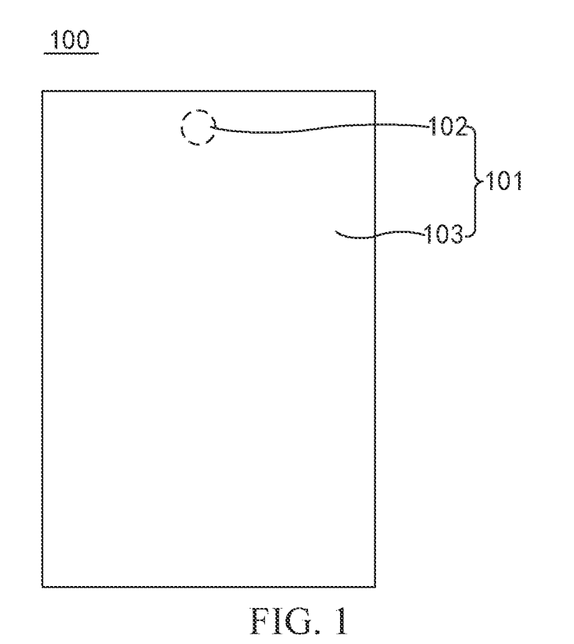
FIG. 1 is a schematic diagram of an OLED display panel according to an embodiment of the present disclosure.
Figure 2:
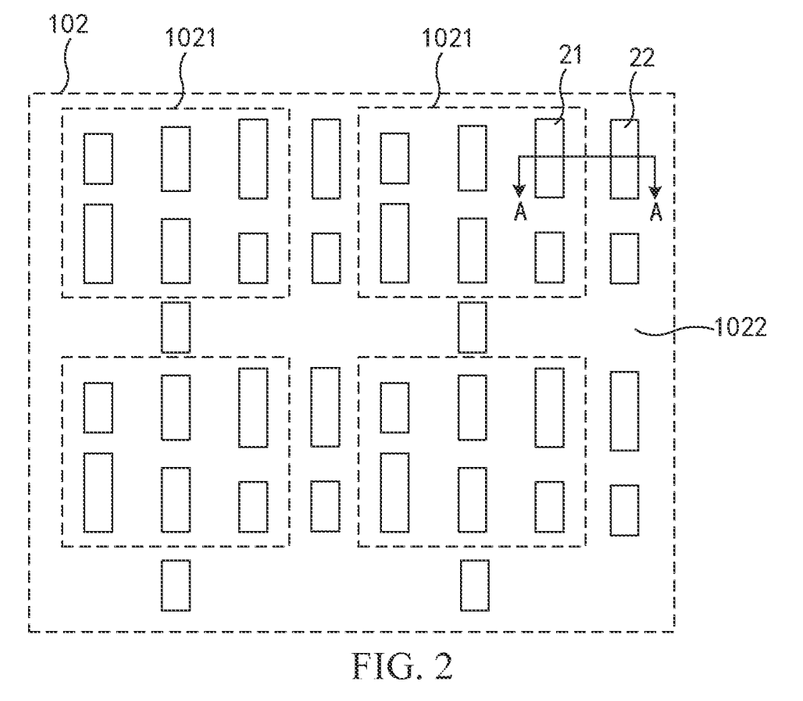
FIG. 2 is a schematic diagram of a CUP area of the OLED display panel according to an embodiment of the present disclosure.

It should be noted that the CUP area 102 refers to an area corresponding to a photosensitive element 200. In addition to the CUP area 102, a remaining area in the display area 101 is a conventional display area 103. Compared to a plurality of pixel units in the conventional display area 103, a spacing between pixel units in the CUP area 102 is larger, so that more light can pass through the CUP area 102 to allow the photosensitive element 200 to work normally. However, since the CUP area 102 still has the pixel units, the pixel units will shield light and cause a lower transmittance in the CUP area 102, thereby causing a poorer photosensitive effect of the photosensitive element 200.

The pixel areas 1021 in the CUP area 102 refer to areas where the pixel units of the CUP area 102 are located. That is, one pixel area 1021 corresponds to one pixel unit, and one pixel unit includes a plurality of sub-pixels (such as three, four, or six sub-pixels). The TFT 11 in the pixel areas 1021 refers to a TFT 11 of one sub-pixel in the pixel areas 1021, and one TFT 11 and one first light-emitting device 21 constitute one sub-pixel. In the present disclosure, by disposing the second light-emitting device 22 in the light-transmitting area 1022 and allowing the second light-emitting device 22 to have the first transparent electrode 221 and the second transparent electrode 223, the second light-emitting device 22 can emit light at both sides (that is, the second light-emitting device 22 can emit light upward and downward), and external light can also pass through the second light-emitting device 22, thereby improving the transmittance in the CUP area 102. Also, the second light-emitting device 22 is connected to the first light-emitting device 21 of the pixel areas 1021. That is, the second light-emitting device 22 is driven by a sub-pixel adjacent to the second light-emitting device 22. Therefore, there is no need to dispose driving circuits in the light-transmitting area 1022, which reduces light-blocking structures, thereby improving the transmittance in the CUP area 102 and further improving the photosensitive effect of the photosensitive element 200.

In addition, a number of the second light-emitting device 22 may be multiple. Each second light-emitting device 22 is driven by an adjacent sub-pixel, and second light-emitting devices 22 in the light-transmitting area 1022 are equivalent to sub-pixels that can transmit light, which can increase a pixel density of the CUP area 102. Therefore, display resolution (PPI) can be improved, a display difference between the CUP area 102 and the conventional display area 103 can be reduced, thereby improving display effect.

The embodiments of the present disclosure do not specifically limit applications of the OLED display panel 100, which can be any product or component having display functions, such as a television, a laptop, a tablet, a wearable display device (such as a smart bracelet, a smart watch, etc.), a mobile phone, a virtual reality device, an augmented reality equipment, a vehicle display, an advertising light box, etc.

In some embodiments, referring to FIGS. 3 and 4, the OLED display panel 100 further includes a pixel definition layer 3 disposed on the light-emitting device layer 2. The pixel definition layer 3 can define an area for accommodating the first light-emitting device 21 (that is, the pixel areas 1021), and an area for accommodating the second light-emitting device 22.

In some embodiments, referring to FIGS. 3 and 4, the first light-emitting device 21 includes a first electrode 211, a first OLED functional layer 212 disposed on the first electrode 211, and a second electrode 213 disposed on the first OLED functional layer 212. The first transparent electrode 221 is connected to the first electrode 211, and the second transparent electrode 223 is connected to the second electrode 213, so that the TFT 11 located in the pixel areas 1021 can drive the first light-emitting device 21 and the second light-emitting device 22 at a same time. Therefore, the sub-pixel adjacent to the second light-emitting device 22 can drive the second light-emitting device 22, and there is no need to dispose the driving circuits in the light-transmitting area 1022, which reduces the light-blocking structures, thereby improving the transmittance in the CUP area 102 and further improving the photosensitive effect of the photosensitive element 200.

In the embodiment, the first transparent electrode 221 is integrally formed with the first electrode 211, and the second transparent electrode 223 is integrally formed with the second electrode 213. That is, the first transparent electrode 221 and the first electrode 211 are integrated as a material layer made at a same time, and the second transparent electrode 223 and the second electrode 213 are integrated as a material layer made at a same time. Therefore, processes can be simplified, and it can ensure that the second light-emitting device 22 can be driven by the sub-pixel adjacent to the second light-emitting device 22.

In the embodiment, the second OLED functional layer 222 is integrally formed with the first OLED functional layer 212. That is, the second OLED functional layer 222 and the first OLED functional layer 212 are material layers made at a same time, which can simplify the processes and can allow light-emitting colors and brightness of the second light-emitting device 22 and the first light-emitting device 21 to be similar or same, thereby improving display uniformity in the CUP area 102.

In the embodiment, the first transparent electrode 221 and the first electrode 211 may be anodes, and the second transparent electrode 223 and the second electrode 213 may be cathodes. The second OLED functional layer 222 and the first OLED functional layer 212 include a hole transport layer, a light-emitting layer disposed on the hole transport layer, and an electron transport layer disposed on the light-emitting layer.

In addition, in order to improve luminous efficiency, the second OLED functional layer 222 and the first OLED functional layer 212 may further include a hole injection layer disposed under the hole transport layer, and an electron injection layer disposed on the electron transport layer.

In the embodiment, referring to FIG. 3, the first electrode 211 includes a first transparent metal oxide layer 2111, a metal layer 2112 disposed on the first transparent metal oxide layer 2111, and a second transparent metal oxide layer 2113 disposed on the metal layer 2112. The first transparent electrode 221 is integrally formed with the first transparent metal oxide layer 2111. The metal layer 2112 can reflect light to allow the first light-emitting device 21 in the pixel areas 1021 to emit light toward one direction (ie, upward) and can improve the luminous efficiency of the first light-emitting device 21. In addition, the first electrode 211 is a stacked multi-layer structure, which can reduce a voltage drop (IR drop). The first transparent electrode 221 and the first transparent metal oxide layer 2111 are material layers made at the same time, which can simplify the processes and allow the first transparent electrode 221 to transmit light, thereby improving the transmittance in the CUP area 102 and further improving the photosensitive effect of the photosensitive element 200.

In the embodiment, a material of the first transparent electrode 221 and the first transparent metal oxide layer 2111 may be indium tin oxide (ITO). Of course, it may also be other materials, such as indium zinc oxide, which is not limited therein.

A material of the metal layer 2112 may be silver (Ag). Of course, it may also be other materials, such as copper, aluminum, molybdenum, titanium, or other metals, which are not limited therein.

A material of the second transparent metal oxide layer 2113 may be indium tin oxide. Of course, it may also be other materials, such as indium zinc oxide, which is not limited therein.

Figure 7:
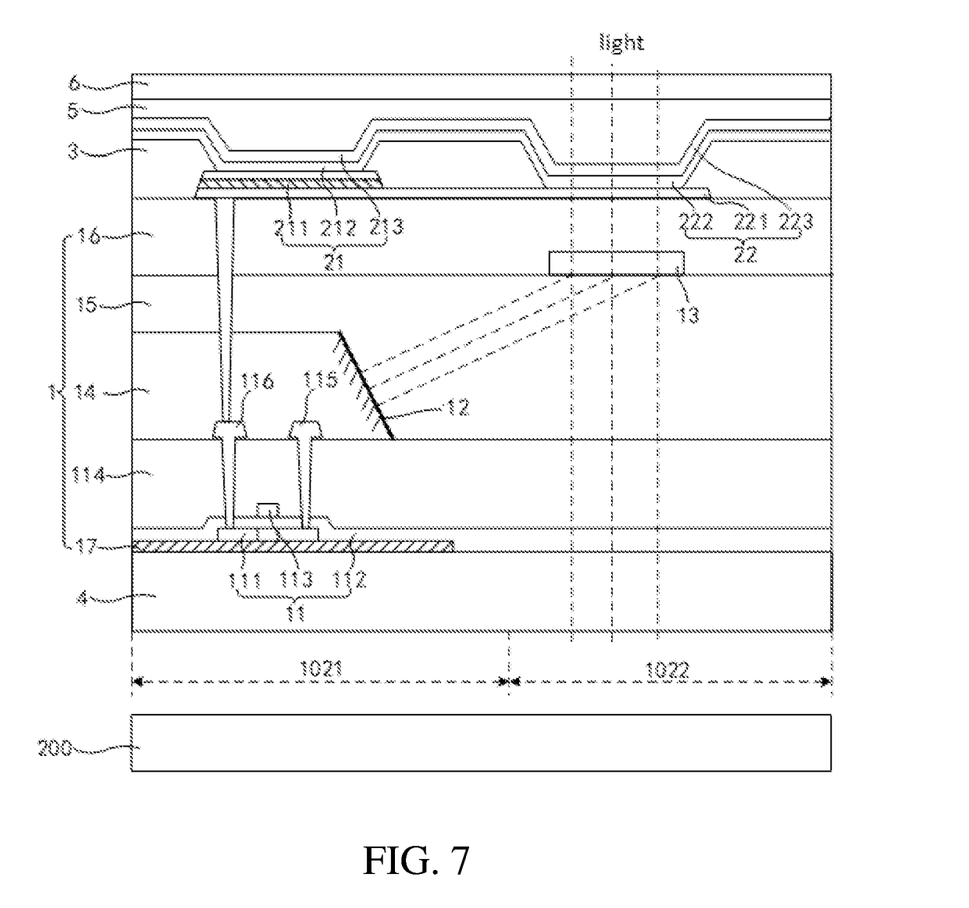
FIG. 7 is a schematic diagram of the OLED display module according to another embodiment of the present disclosure.

In some embodiments, referring to FIGS. 4 and 7, the TFT array substrate 1 further includes a reflection unit 12 disposed in the pixel areas 1021 and a refraction unit 13 disposed in the light-transmitting area 1022. The refraction unit 13 is disposed directly below the second light-emitting device 22 for refracting a part of light emitted from the second light-emitting device 22 and/or a part of external light to the reflection unit 12 and for refracting reflected light from the reflection unit 12 outside the OLED display panel 100. That is, the present disclosure disposes the refraction unit 13 can prevent from disposing the reflection unit 12 in the light-transmitting area 1022, thereby preventing from affecting the transmittance in the CUP area 102. Further, by the cooperation of the refraction unit 13 and the reflection unit 12, a part of light propagating downward can be reflected back to the second light-emitting device 22 and directed to outside of the OLED display panel 100 to compensate for a light loss of light passing through the first transparent electrode 221. Therefore, the display difference between the second light-emitting device 22 and the first light-emitting device 21 can be reduced, and the display effect can be improved.

In addition, the refraction unit 13 will only refract a part of the light incident on the refraction unit 13, and another part of the light will pass through the refraction unit 13 and the CUP area 102 and be directed to the photosensitive element 200. Therefore, when the second light-emitting device 22 does not emit light, the photosensitive element 200 can still receive light to maintain a high information collection efficiency and maintain a good imaging effect.

Figure 5A:
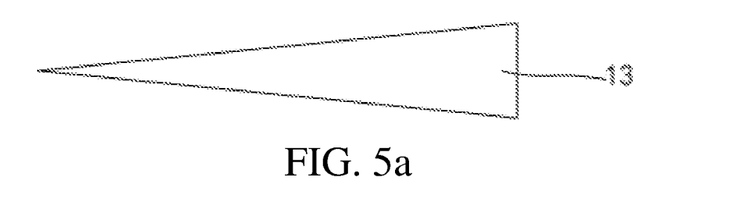
FIG. 5a is a schematic diagram of a reflection unit of the OLED display panel according to an embodiment of the present disclosure.
Figure 5B:
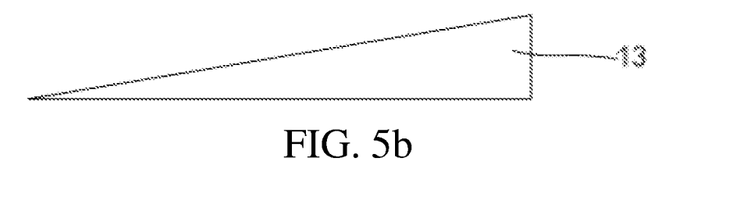
FIG. 5b is a schematic diagram of the reflection unit of the OLED display panel according to another embodiment of the present disclosure.
Figure 5C:
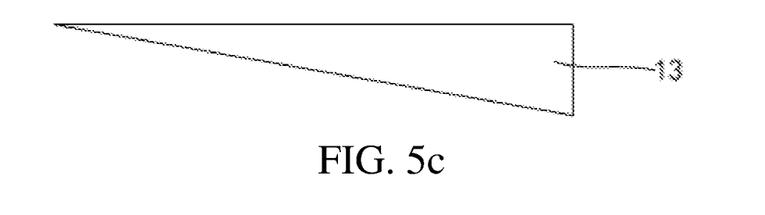
FIG. 5c is a schematic diagram of the reflection unit of the OLED display panel according to yet another embodiment of the present disclosure.

In the embodiment, referring to FIGS. 5a to 5c, a cross-sectional shape of the refraction unit 13 may be triangular, such as isosceles or right triangles. Of course, other shapes that can be refracted may also be used, such as elliptical or semi-elliptical shapes, which are not limited therein. A material of the refraction unit 13 may be silicone resin, polydimethylsiloxane (PDMS), or polymethyl methacrylate (PMMA). Of course, the material of the refraction unit 13 may also be other materials, which is not limited therein.

The reflection unit 12 may be a metal with a reflection function, such as copper or aluminum, which is not limited therein.

In this embodiment, referring to FIG. 4, the TFT array substrate 1 further includes a first insulating layer 14 disposed on the TFT 11, wherein, a side surface of the first insulating layer 14 is an inclined plane, and the reflection unit 12 is disposed on the inclined plane; and a second insulating layer 15 disposed on the TFT 11, the reflection unit 12, and the first insulating layer 14, wherein, the refraction unit 13 is disposed on the second insulating layer 15. That is, in the present disclosure, the side surface of the first insulating layer 14 is defined to be the inclined plane, the inclined plane is located in the pixel areas 1021, and the reflection unit 12 is disposed on the inclined plane, which can allow the reflection unit 12 to be tilted toward the refraction unit 13 to ensure that the reflection unit 12 can reflect the light refracted by the refraction unit 13 to compensate for the light loss of the light passing through the first transparent electrode 221.

In addition, the TFT array substrate 1 further includes a third insulating layer 16, and the third insulating layer 16 is disposed on the second insulating layer 15 and the refraction unit 13. The light-emitting device layer 2 is disposed on the third insulating layer 16. The second insulating layer 15 and the third insulating layer 16 may also serve as a planarization layer 114.

In the embodiment, referring to FIG. 4, the TFT array substrate 1 further includes a light-shielding layer 17 disposed under the TFT 11, and the reflection unit 12 is disposed directly above the light-shielding layer 17. The light-shielding layer 17 and the reflection unit 12 can simultaneously block light to prevent light from being irradiated on an active layer 111 in the TFT 11, thereby preventing the TFT 11 from losing effectiveness, and improving reliability of the TFT 11.

In addition, a refractive index of the refraction unit 13 may also be controlled according to relative positions of the refraction unit 13 and the reflection unit 12, so that all the light refracted by the refraction unit 13 may be incident on the reflection unit 12 instead of entering the TFT 11. Therefore, the reliability of the TFT 11 may be further improved, and a compensation for the light loss can also be improved.

In the embodiment, referring to FIGS. 3 and 4, the TFT 11 includes the active layer 111 disposed on the light-shielding layer 17, a gate insulating layer 112 disposed on the active layer 111, a gate electrode 113 disposed on the gate insulating layer 112, a planarization layer 114 disposed on the gate insulating layer 112 and the gate electrode 113, and a source electrode 115 and a drain electrode 116 disposed on the planarization layer 114, and the source electrode 115 and the drain electrode 116 are connected to the active layer 111. The first electrode 211 is connected to the drain electrode 116.

In addition, an area of the light-shielding layer 17 is larger than that of the active layer 111 to improve a light-shielding effect.

In some embodiments, referring to FIGS. 3 and 4, the OLED display panel 100 further includes a substrate 4, and the TFT array substrate 1 is disposed on the substrate 4. If the OLED display panel 100 is rigid, the substrate 4 may be a rigid material, such as glass. If the OLED display panel 100 is flexible, the substrate 4 may be a flexible material, for example, the substrate 4 may be a stacked structure of an inorganic barrier layer and an organic buffer layer. A material of the inorganic barrier layer may be one or a combination of silicon nitride, silicon oxide, or silicon oxynitride. A material of the organic buffer layer may be polyimide (PI), polyethylene terephthalate (PET), or polydimethylsiloxane (PDMS).

In some embodiments, referring to FIGS. 3 and 4, the OLED display panel 100 further includes an encapsulation layer 5 disposed on the light-emitting device layer 2 and a protective coverplate 6 disposed on the encapsulation layer 5.

Figure 6:
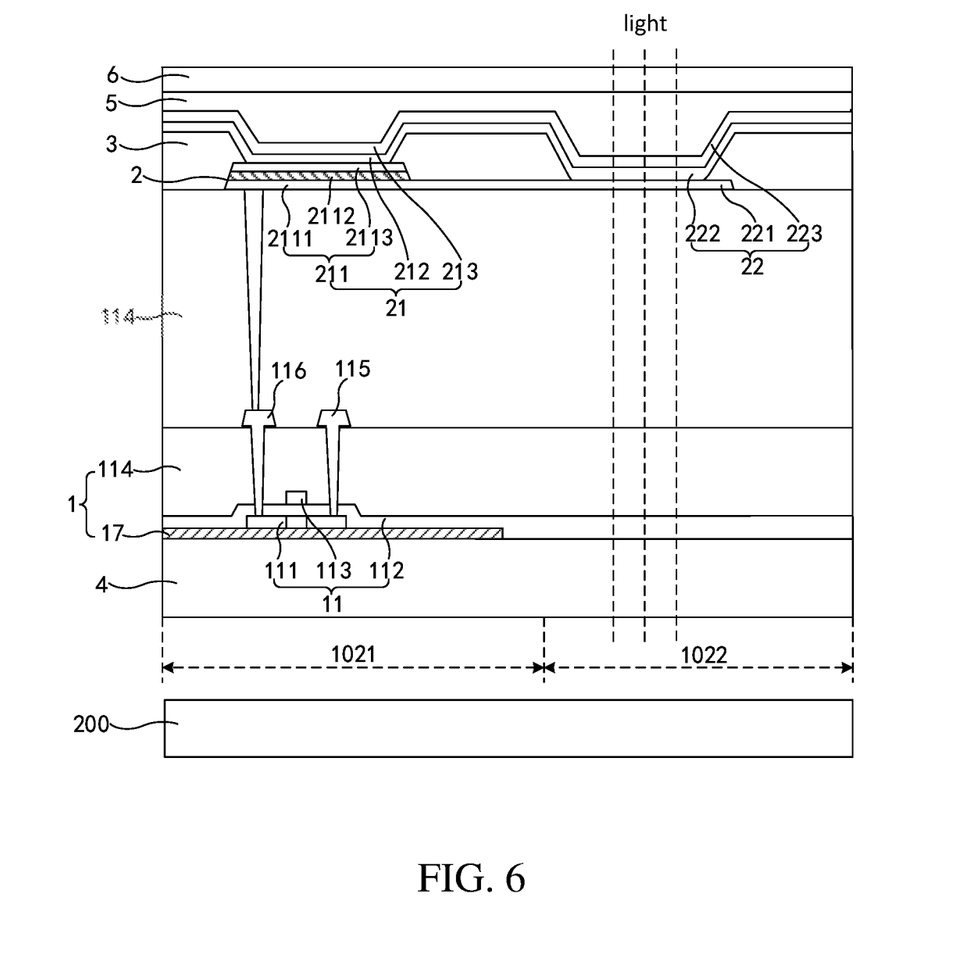
FIG. 6 is a schematic diagram of an OLED display module according to an embodiment of the present disclosure.

Referring to FIGS. 6 and 7, based on the above OLED display panel 100, an embodiment of the present disclosure further provides an OLED display module, which includes the above OLED display panel 100 and the photosensitive element 200, and the photosensitive element 200 is located below the CUP area 102.

It should be noted that in the present disclosure, by disposing the second light-emitting device 22 in the light-transmitting area 1022 and allowing the second light-emitting device 22 to have the first transparent electrode 221 and the second transparent electrode 223, the second light-emitting device 22 can emit light at both sides, and external light can also pass through the second light-emitting device 22, thereby improving the transmittance in the CUP area 102. Also, the second light-emitting device 22 is connected to the first light-emitting device 21 of the pixel areas 1021. That is, the second light-emitting device 22 is driven by a sub-pixel adjacent to the second light-emitting device 22. Therefore, there is no need to dispose the driving circuits in the light-transmitting area 1022, which reduces light-blocking structures, thereby improving the transmittance in the CUP area 102 and further improving the photosensitive effect of the photosensitive element 200.

In addition, a number of the second light-emitting device 22 may be multiple. Each second light-emitting device 22 is driven by an adjacent sub-pixel, and the second light-emitting devices 22 in the light-transmitting area 1022 are equivalent to the sub-pixels that can transmit light, which can increase the pixel density of the CUP area 102. Therefore, the display resolution (PPI) can be improved, the display difference between the CUP area 102 and the conventional display area 103 can be reduced, thereby improving the display effect.

Figure 8:
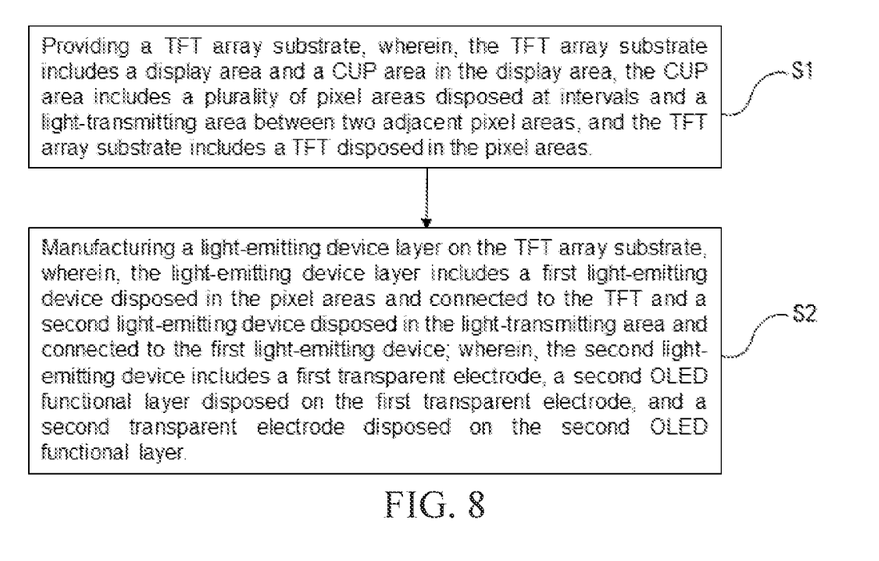
FIG. 8 is a flowchart of a manufacturing method of the OLED display panel according to an embodiment of the present disclosure.

Referring to FIG. 8, based on the above OLED display panel 100, an embodiment of the present disclosure further provides a manufacturing method of an OLED display panel, which includes following steps.

Step S1: providing a TFT array substrate 1, wherein the TFT array substrate 1 includes a display area 101 and a CUP area 102 in the display area 101, the CUP area 102 includes a plurality of pixel areas 1021 disposed at intervals and a light-transmitting area 1022 between two adjacent pixel areas 1021, and the TFT array substrate 1 includes a TFT 11 disposed in the pixel areas 1021.

Step S2: manufacturing a light-emitting device layer 2 on the TFT array substrate 1, wherein, the light-emitting device layer 2 includes a first light-emitting device 21 disposed in the pixel areas 1021 and connected to the TFT 11 and a second light-emitting device 22 disposed in the light-transmitting area 1022 and connected to the first light-emitting device 21. The second light-emitting device 22 includes a first transparent electrode 221, a second OLED functional layer 222 disposed on the first transparent electrode 221, and a second transparent electrode 223 disposed on the second OLED functional layer 222.

It should be noted that in the present disclosure, by disposing the second light-emitting device 22 in the light-transmitting area 1022 and allowing the second light-emitting device 22 to have the first transparent electrode 221 and the second transparent electrode 223, the second light-emitting device 22 can emit light at both sides, and external light can also pass through the second light-emitting device 22, thereby improving the transmittance in the CUP area 102. Also, the second light-emitting device 22 is connected to the first light-emitting device 21 of the pixel areas 1021. That is, the second light-emitting device 22 is driven by a sub-pixel adjacent to the second light-emitting device 22. Therefore, there is no need to dispose driving circuits in the light-transmitting area 1022, which reduces light-blocking structures, thereby improving the transmittance in the CUP area 102 and further improving the photosensitive effect of the photosensitive element 200.

In addition, a number of the second light-emitting device 22 may be multiple. Each second light-emitting device 22 is driven by an adjacent sub-pixel, and the second light-emitting devices 22 in the light-transmitting area 1022 are equivalent to the sub-pixels that can transmit light, which can increase the pixel density of the CUP area 102. Therefore, the display resolution (PPI) can be improved, the display difference between the CUP area 102 and the conventional display area 103 can be reduced, thereby improving the display effect.

In some embodiments, the first light-emitting device 21 includes a first electrode 211, a first OLED functional layer 212 disposed on the first electrode 211, and a second electrode 213 disposed on the first OLED functional layer 212. The first transparent electrode 221 is connected to the first electrode 211, and the second transparent electrode 223 is connected to the second electrode 213, so that the TFT 11 located in the pixel areas 1021 can drive the first light-emitting device 21 and the second light-emitting device 22 at the same time. Therefore, the sub-pixel adjacent to the second light-emitting device 22 can drive the second light-emitting device 22, and there is no need to dispose the driving circuits in the light-transmitting area 1022, which reduces the light-blocking structures, thereby improving the transmittance in the CUP area 102 and further improving the photosensitive effect of the photosensitive element 200.

In the embodiment, the first transparent electrode 221 is integrally formed with the first electrode 211, and the second transparent electrode 223 is integrally formed with the second electrode 213. That is, in the manufacturing process of the light-emitting device layer 2 in the step S2, the first transparent electrode 221 and the first electrode 211 are integrated as a material layer made at the same time, and the second transparent electrode 223 and the second electrode 213 are integrated as a material layer made at the same time. Therefore, processes can be simplified, and it can ensure that the second light-emitting device 22 can be driven by the sub-pixel adjacent to the second light-emitting device 22.

In the embodiment, that is, in the manufacturing process of the light-emitting device layer 2 in the step S2, the second OLED functional layer 222 is integrally formed with the first OLED functional layer 212. That is, the second OLED functional layer 222 and the first OLED functional layer 212 are material layers made at the same time, which can simplify the processes and can allow the light-emitting colors and brightness of the second light-emitting device 22 and the first light-emitting device 21 to be similar or same, thereby improving the display uniformity in the CUP area 102.

In the embodiment, the first electrode 211 includes a first transparent metal oxide layer 2111, a metal layer 2112 disposed on the first transparent metal oxide layer 2111, and a second transparent metal oxide layer 2113 disposed on the metal layer 2112. The first transparent electrode 221 is integrally formed with the first transparent metal oxide layer 2111. The metal layer 2112 can reflect light to allow the first light-emitting device 21 in the pixel areas 1021 to emit light toward one direction (ie, upward) and can improve the luminous efficiency of the first light-emitting device 21. In addition, the first electrode 211 is a stacked multi-layer structure, which can reduce a voltage drop (IR drop). That is, in the manufacturing process of the light-emitting device layer 2 in the step S2, the first transparent electrode 221 and the first transparent metal oxide layer 2111 are material layers made at the same time, which can simplify the processes and allow the first transparent electrode 221 to transmit light, thereby improving the transmittance in the CUP area 102 and further improving the photosensitive effect of the photosensitive element 200.

In some embodiments, the TFT array substrate 1 further includes a reflection unit 12 disposed in the pixel areas 1021 and a refraction unit 13 disposed in the light-transmitting area 1022. The refraction unit 13 is disposed directly below the second light-emitting device 22 for refracting a part of light emitted from the second light-emitting device 22 and/or a part of external light to the reflection unit 12 and for refracting reflected light from the reflection unit 12 outside the OLED display panel 100. That is, the present disclosure disposes the refraction unit 13 can prevent from disposing the reflection unit 12 in the light-transmitting area 1022, thereby preventing from affecting the transmittance in the CUP area 102. Further, by the cooperation of the refraction unit 13 and the reflection unit 12, a part of light propagating downward can be reflected back to the second light-emitting device 22 and directed to outside of the OLED display panel 100 to compensate for a light loss of light passing through the first transparent electrode 221. Therefore, the display difference between the second light-emitting device 22 and the first light-emitting device 21 can be reduced, and the display effect can be improved.

In addition, the refraction unit 13 will only refract a part of the light incident on the refraction unit 13, and another part of the light will pass through the refraction unit 13 and the CUP area 102 and be directed to the photosensitive element 200. Therefore, when the second light-emitting device 22 does not emit light, the photosensitive element 200 can still receive light to maintain a high information collection efficiency and maintain a good imaging effect.

In the embodiment, the manufacturing method of the TFT array substrate 1 in the step S1 includes following steps:
 disposing the first insulating layer 14 on the TFT 11 and patterning the first insulating layer 14 to allow the side surface of the first insulating layer 14 to be the inclined plane located in the pixel areas 1021;
 manufacturing the reflection unit 12 on the inclined plane;
 disposing the second insulating layer 15 on the TFT 11, the reflection unit 12, and the first insulating layer 14;
 manufacturing the refraction unit 13 on the second insulating layer 15 to allow the refraction unit 13 to be located just below the second light-emitting device 22; and
 disposing the third insulating layer 16 on the second insulating layer 15 and the refraction unit 13.

In the above embodiments, the description of each embodiment has its own emphasis. For the parts that are not described in detail in an embodiment, refer to the detailed description of other embodiments above. In specific implementation, each of the above units or structures can be implemented as independent entities, or can be combined arbitrarily to be implemented as the same or several entities. The specific implementation of each of the above units or structures can be referred to the previous method embodiments, and will not be repeated here.

The OLED display panel, the manufacturing method thereof, and the OLED display module provided by the embodiments of the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. An organic light-emitting diode (OLED) display panel, comprising a display area and a camera-under-panel (CUP) area in the display area, wherein the CUP area comprises a plurality of pixel areas disposed at intervals and a light-transmitting area between two adjacent pixel areas, and the OLED display panel comprises:
 a thin film transistor (TFT) array substrate comprising a TFT disposed in the pixel areas; and
 a light-emitting device layer disposed on the TFT array substrate, wherein the light-emitting device layer comprises a first light-emitting device disposed in the pixel areas and connected to the TFT and a second light-emitting device disposed in the light-transmitting area and connected to the first light-emitting device;
 wherein the second light-emitting device comprises a first transparent electrode, a second OLED functional layer disposed on the first transparent electrode, and a second transparent electrode disposed on the second OLED functional layer; and
 wherein the first light-emitting device comprises a first electrode, a first OLED functional layer disposed on the first electrode, and a second electrode disposed on the first OLED functional layer, the first transparent electrode is connected to the first electrode, and the second transparent electrode is connected to the second electrode.

2. The OLED display panel according to claim 1, wherein the first transparent electrode is integrally formed with the first electrode, and the second transparent electrode is integrally formed with the second electrode.

3. The OLED display panel according to claim 2, wherein the second OLED functional layer is integrally formed with the first OLED functional layer.

4. The OLED display panel according to claim 1, wherein the first electrode comprises a first transparent metal oxide layer, a metal layer disposed on the first transparent metal oxide layer, and a second transparent metal oxide layer disposed on the metal layer; and
 the first transparent electrode is integrally formed with the first transparent metal oxide layer.

5. The OLED display panel according to claim 1, wherein the TFT array substrate further comprises a reflection unit disposed in the pixel areas, and a refraction unit disposed in the light-transmitting area; and
 the refraction unit is disposed directly below the second light-emitting device for refracting a part of light emitted from the second light-emitting device or a part of external light to the reflection unit and for refracting reflected light from the reflection unit outside the OLED display panel.

6. The OLED display panel according to claim 5, wherein the TFT array substrate further comprises:
 a first insulating layer disposed on the TFT, wherein a side surface of the first insulating layer is an inclined plane, and the reflection unit is disposed on the inclined plane; and
 a second insulating layer disposed on the TFT, the reflection unit, and the first insulating layer, wherein the refraction unit is disposed on the second insulating layer.

7. The OLED display panel according to claim 6, wherein the TFT array substrate further comprises a light-shielding layer disposed under the TFT, and the reflection unit is disposed directly above the light-shielding layer.

8. An organic light-emitting diode (OLED) display module, comprising an OLED display panel and a photosensitive element;
 wherein the OLED display panel comprises a display area and a camera-under-panel (CUP) area in the display area, the CUP area comprises a plurality of pixel areas disposed at intervals and a light-transmitting area between two adjacent pixel areas, and the OLED display panel comprises:
 a thin film transistor (TFT) array substrate comprising a TFT disposed in the pixel areas; and
 a light-emitting device layer disposed on the TFT array substrate, wherein the light-emitting device layer comprises a first light-emitting device disposed in the pixel areas and connected to the TFT and a second light-emitting device disposed in the light-transmitting area and connected to the first light-emitting device;
 wherein the second light-emitting device comprises a first transparent electrode, a second OLED functional layer disposed on the first transparent electrode, and a second transparent electrode disposed on the second OLED functional layer;

wherein the photosensitive element is disposed under the CUP area; and wherein the first light-emitting device comprises a first electrode, a first OLED functional layer disposed on the first electrode, and a second electrode disposed on the first OLED functional layer, the first transparent electrode is connected to the first electrode, and the second transparent electrode is connected to the second electrode.

9. The OLED display module according to claim 8, wherein the first transparent electrode is integrally formed with the first electrode, and the second transparent electrode is integrally formed with the second electrode.

10. The OLED display module according to claim 9, wherein the second OLED functional layer is integrally formed with the first OLED functional layer.

11. The OLED display module according to claim 8, wherein the first electrode comprises a first transparent metal oxide layer, a metal layer disposed on the first transparent metal oxide layer, and a second transparent metal oxide layer disposed on the metal layer; and the first transparent electrode is integrally formed with the first transparent metal oxide layer.

12. The OLED display module according to claim 8, wherein the TFT array substrate further comprises a reflection unit disposed in the pixel areas, and a refraction unit disposed in the light-transmitting area; and the refraction unit is disposed directly below the second light-emitting device for refracting a part of light emitted from the second light-emitting device or a part of external light to the reflection unit and for refracting reflected light from the reflection unit outside the OLED display panel.

13. The OLED display module according to claim 12, wherein the TFT array substrate further comprises:

a first insulating layer disposed on the TFT, wherein a side surface of the first insulating layer is an inclined plane, and the reflection unit is disposed on the inclined plane; and a second insulating layer disposed on the TFT, the reflection unit, and the first insulating layer, wherein the refraction unit is disposed on the second insulating layer.

14. The OLED display module according to claim 13, wherein the TFT array substrate further comprises a light-shielding layer disposed under the TFT, and the reflection unit is disposed directly above the light-shielding layer.

15. A manufacturing method of an organic light-emitting diode (OLED) display panel, comprising following steps:

providing a thin film transistor (TFT) array substrate, wherein the TFT array substrate comprises a display area and a camera-under-panel (CUP) area in the display area, the CUP area comprises a plurality of pixel areas disposed at intervals and a light-transmitting area between two adjacent pixel areas, and the TFT array substrate comprises a TFT disposed in the pixel areas; and manufacturing a light-emitting device layer on the TFT array substrate, wherein the light-emitting device layer comprises a first light-emitting device disposed in the pixel areas and connected to the TFT and a second light-emitting device disposed in the light-transmitting area and connected to the first light-emitting device; wherein the second light-emitting device comprises a first transparent electrode, a second OLED functional layer disposed on the first transparent electrode, and a second transparent electrode disposed on the second OLED functional layer;

wherein the first light-emitting device comprises a first electrode, a first OLED functional layer disposed on the first electrode, and a second electrode disposed on the first OLED functional layer, the first transparent electrode is connected to the first electrode, and the second transparent electrode is connected to the second electrode.

16. The manufacturing method of the OLED display panel according to claim 15, wherein the first transparent electrode is integrally formed with the first electrode, and the second transparent electrode is integrally formed with the second electrode.

17. The manufacturing method of the OLED display panel according to claim 16, wherein the second OLED functional layer is integrally formed with the first OLED functional layer.

* * * * *